United States Patent
Vogelbacher et al.

(10) Patent No.: US 10,151,292 B2
(45) Date of Patent: Dec. 11, 2018

(54) CONTROL DEVICE WITH THERMAL FUSE HAVING REMOVABLE PRE-TENSION ELEMENT

(71) Applicant: MAGNA ELECTRONICS INC., Auburn Hills, MI (US)

(72) Inventors: Michael Vogelbacher, Albbruck (DE); Andreas Baumgartner, Görwihl (DE)

(73) Assignee: MAGNA ELECTRONICS INC., Auburn Hills, MI (US)

( * ) Notice: Subject to any disclaimer, the term of this patent is extended or adjusted under 35 U.S.C. 154(b) by 0 days.

(21) Appl. No.: 15/460,663

(22) Filed: Mar. 16, 2017

(65) Prior Publication Data
US 2017/0276115 A1    Sep. 28, 2017

Related U.S. Application Data

(60) Provisional application No. 62/312,126, filed on Mar. 23, 2016.

(51) Int. Cl.
*H01H 37/76*    (2006.01)
*H05K 1/18*    (2006.01)
(Continued)

(52) U.S. Cl.
CPC ............. *F02P 19/027* (2013.01); *F02P 19/02* (2013.01); *H01H 37/761* (2013.01);
(Continued)

(58) Field of Classification Search
CPC ........... F02P 19/027; H02H 5/04; H01R 4/02; H05K 1/181; H05K 2201/10181; H01H 37/761
(Continued)

(56) References Cited

U.S. PATENT DOCUMENTS 2,790,049 A * 4/1957 McAlister ............ H01H 37/761
337/405
3,763,454 A * 10/1973 Zandonatti ........... H01H 37/761
337/404
(Continued)

FOREIGN PATENT DOCUMENTS

DE    2058357    11/1970
DE    7520602    10/1975
(Continued)

*Primary Examiner* — Anatoly Vortman
(74) *Attorney, Agent, or Firm* — Honigman Miller Schwartz and Cohn LLP

(57) ABSTRACT

A control device suitable for use in a vehicle includes a circuit board and a thermal fuse holder including a removable spacer element and a plurality of breaker elements. The thermal fuse holder is attached at a terminal structure and, when the terminal structure is attached to the circuit board, the breaker elements engage the removable spacer element to hold the breaker elements at the circuit board. After terminals of the terminal structure and the breaker elements are soldered at the circuit board, the removable spacer element is removed from the thermal fuse holder, whereby the breaker elements are held at the circuit board via solder joints and are biased away from the circuit board. When the temperature at a respective solder joint exceeds a threshold temperature that melts the solder, the respective breaker element moves away from the circuit board to break the electrical connection at the solder joint.

20 Claims, 6 Drawing Sheets

(51) Int. Cl.
*F02P 19/02* (2006.01)
*H02H 5/04* (2006.01)
*H01R 4/02* (2006.01)
*H05K 1/02* (2006.01)

(52) U.S. Cl.
CPC ..... *H05K 1/0201* (2013.01); *H01H 2037/763* (2013.01); *H05K 2201/10181* (2013.01)

(58) Field of Classification Search
USPC .......................................................... 337/2
See application file for complete search history.

(56) References Cited

U.S. PATENT DOCUMENTS

| | | | | |
|---|---|---|---|---|
| 4,047,143 | A * | 9/1977 | Burden | H01H 85/36 337/239 |
| 4,442,804 | A | 4/1984 | Morgan | |
| 4,661,881 | A * | 4/1987 | Watson | H01H 85/048 337/239 |
| 5,192,937 | A * | 3/1993 | Lee | H01C 1/00 337/104 |
| 5,280,262 | A * | 1/1994 | Fischer | H01H 37/761 337/402 |
| 5,563,570 | A * | 10/1996 | Lee | H01C 1/084 310/68 C |
| 5,600,295 | A * | 2/1997 | Kaufmann | H01H 37/761 337/402 |
| 5,612,662 | A * | 3/1997 | Drekmeier | H01H 37/761 29/623 |
| 5,770,993 | A * | 6/1998 | Miyazawa | H01C 7/13 337/142 |
| 5,793,274 | A * | 8/1998 | Kelly | H01H 85/36 337/141 |
| 5,896,080 | A * | 4/1999 | Chen | H01H 37/761 337/401 |
| 6,175,480 | B1 | 1/2001 | Karmazyn | |
| 7,002,785 | B1 * | 2/2006 | Bothe | H01H 37/76 361/103 |
| 7,023,674 | B2 * | 4/2006 | Gross | H01H 37/761 337/407 |
| 7,639,114 | B2 * | 12/2009 | Yu | H01H 37/761 29/623 |
| 7,864,024 | B2 * | 1/2011 | Schlenker | H01H 37/761 337/239 |
| 8,665,057 | B2 * | 3/2014 | Schlenker | H01H 37/761 337/239 |
| 8,749,940 | B2 * | 6/2014 | Schmidtlein | H01H 37/761 361/103 |
| 9,472,364 | B2 * | 10/2016 | Matthiesen | H01H 37/70 |
| 9,620,321 | B2 * | 4/2017 | Storzinger | H01H 37/761 |
| 9,670,895 | B2 * | 6/2017 | Vogelbacher | F02P 19/02 |
| 9,890,760 | B2 * | 2/2018 | Vogelbacher | F02P 19/027 |
| 2009/0127249 | A1 | 5/2009 | Bauer | |
| 2013/0298866 | A1 * | 11/2013 | Vogelbacher | F02P 19/02 123/179.6 |
| 2014/0355162 | A1 * | 12/2014 | Biegert | F02P 19/027 361/103 |
| 2016/0032885 | A1 * | 2/2016 | Vogelbacher | F02P 19/027 361/104 |
| 2017/0328336 | A1 | 11/2017 | Vogelbacher | |

FOREIGN PATENT DOCUMENTS

| | | | | |
|---|---|---|---|---|
| DE | 3930819 | | 3/1991 | |
| DE | 4219554 | | 12/1993 | |
| DE | 4437122 | | 4/1996 | |
| DE | 19639427 | | 3/1997 | |
| DE | 19647035 | | 11/1997 | |
| DE | 10044081 | | 4/2002 | |
| DE | 10102235 | | 8/2002 | |
| DE | 102004014660 | | 7/2005 | |
| DE | 102005005549 | | 8/2006 | |
| DE | 102005014601 | | 10/2006 | |
| DE | 102006026406 | | 12/2007 | |
| DE | 102007035899 | | 2/2009 | |
| DE | 102008011226 | | 8/2009 | |
| DE | 102008057166 | | 5/2010 | |
| DE | 102008053182 | * | 7/2010 | .......... H01H 37/761 |
| DE | 102009036578 | | 9/2010 | |
| DE | 102011118724 | | 5/2013 | |
| EP | 1334505 | | 8/2003 | |
| EP | 1467603 | | 10/2004 | |
| EP | 1560242 | | 8/2005 | |
| EP | 2485355 | | 8/2012 | |
| FR | 2978324 | | 1/2013 | |
| WO | WO2004002202 | | 12/2003 | |
| WO | WO2010112389 | | 10/2012 | |

* cited by examiner

CONTROL DEVICE WITH THERMAL FUSE HAVING REMOVABLE PRE-TENSION ELEMENT

CROSS REFERENCE TO RELATED APPLICATION

The present application claims the filing benefits of U.S. provisional application Ser. No. 62/312,126, filed Mar. 23, 2016, which is hereby incorporated herein by reference in its entirety.

FIELD OF THE INVENTION

The present invention relates to control devices and, more particularly, to controls or control devices for controlling glow plugs for diesel engines.

BACKGROUND OF THE INVENTION

Glow plugs are known and are used to pre-heat diesel combustion engine cylinders before starting the engine, particularly when the diesel engine is cold. Devices for glow plug control devices are widely known in automotive applications. The controllers typically switch and control the current through glow plugs. The switched/controlled currents are comparably high. In cases where the metal-oxide-semiconductor field-effect transistors (MOS-FETs) become defective, there is the hazard that the glow plug current flow may not become turned off, and may continue to heat, which may lead to damage to the glow plug due to overheating or may lead to defects/slewing of power cables or discharged batteries.

To have a redundant instance to the MOS-FETs, fuses in the line of power are often implemented. Typically, one time fuses use bi-metals or the like and might be known but uncommon for that job. Solutions are known where the main power line is broken by one single fuse. Other solutions show power line bundles or one single fuse for each power line, which typically equates to the number of the cylinders of the engine.

SUMMARY OF THE INVENTION

The present invention provides a control device or control with a thermal fuse that functions as a thermal protection device or system for the control device. The thermal fuse has a removable spacer element that, during assembly of the control device, urges terminals of fuse or breaker elements towards and into engagement with circuitry at a circuit board. After the terminals of the breaker elements are soldered at the circuitry of the circuit board, the removable spacer element is removed to allow the breaker elements to move away from the circuit board if the solder joints (that hold and electrically connect the terminals of the breaker elements at the circuitry of the circuit board) sufficiently melt. Thus, when a temperature at the circuit element exceeds a threshold temperature, the solder joint at the terminals of the breaker elements melts and the terminals of the breaker elements move away from the circuit board (due to the space created by removing the removable spacer element) to break the electrical connection at the solder joint.

These and other objects, advantages, purposes and features of the present invention will become apparent upon review of the following specification in conjunction with the drawings.

DESCRIPTION OF THE PREFERRED EMBODIMENTS

In diesel engine applications having a single fuse, if the main power line becomes broken by one single fuse, then after the fuse is gone, all of the glow plugs are out of function. If that should happen, then the engine may not be startable.

In diesel engine applications where each power line has its own fuse, such an arrangement allows the user to start the engine even though one fuse might be blown since the other cylinders are still heatable. However, more fuses cost more and take up more space.

Figure 6:
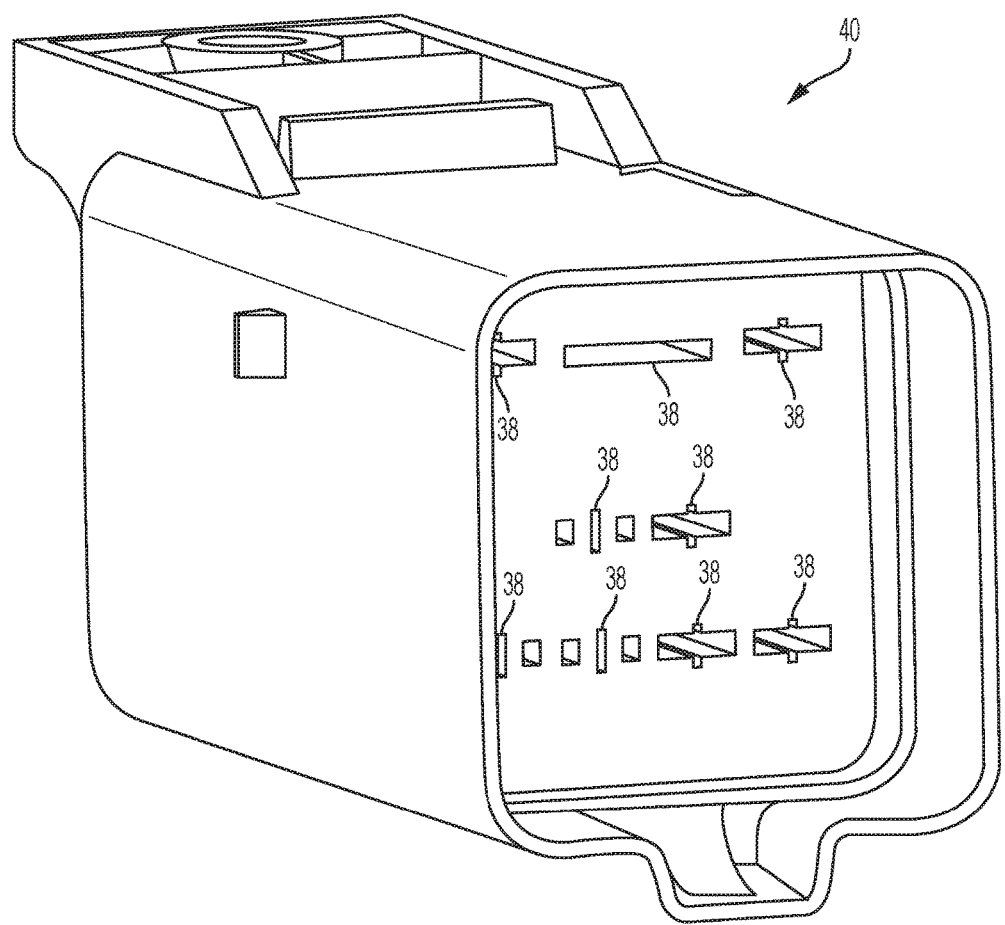
FIG. 6 shows a full assembly of the glow plug control device.

The present invention provides a glow plug control device 40 (a full assembly of such a glow plug control device as it is shipped to the OEM is shown in FIG. 6) having a PCB with an electrical circuit for providing a Diesel engine's glow plug with a controlled current. Each glow plug possesses a circuit breaker, comprising preloaded springs that function by urging or moving a device or element at the circuit board (such as a metal-oxide-semiconductor field-effect transistor or MOS-FET or other element or device of the circuit) or the spring itself serves as a conducting element moving out of a soldering position by its own spring preload when the circuit heats to a threshold temperature. When the circuit heats, the solder at the breakers (electrically connecting the breakers to circuitry at the circuit board) may become fluid or melt to allow for the flexible breakers to disengage from the circuit board and move out of contact with the conducting portion or contact portion of the circuit board, which breaks the current. Optionally, the present invention may utilize aspects of the control devices described in U.S. Publication Nos. US-2016-0032885; US-2014-0355162 and/or US-2013-0298866, which are hereby incorporated herein by reference in their entireties.

As described in U.S. Publication No. US-2014-0355162 (incorporated above), thermal breaker fuses may be provided for glow plug control devices. In there the contact breaker comprises a functional electronic component which is biased out of position, thereby opening the contacts of the PCB pads by a spring force when the functional element heats up due to a short cut malfunction of the glow plug which leads to the melting of the element's solder. The spring is a separate element which gets tensioned (loaded) when the glow plug control housing's lid is closed.

Figure 1:
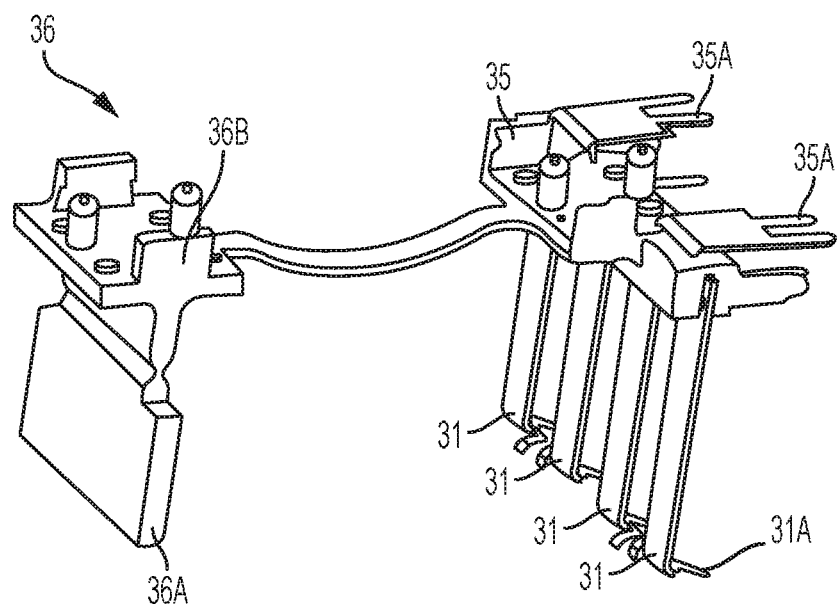
FIG. 1 is a perspective view of thermal breakers or springs as disposed at a plastic thermal fuse holder in accordance with the present invention.
Figure 2:
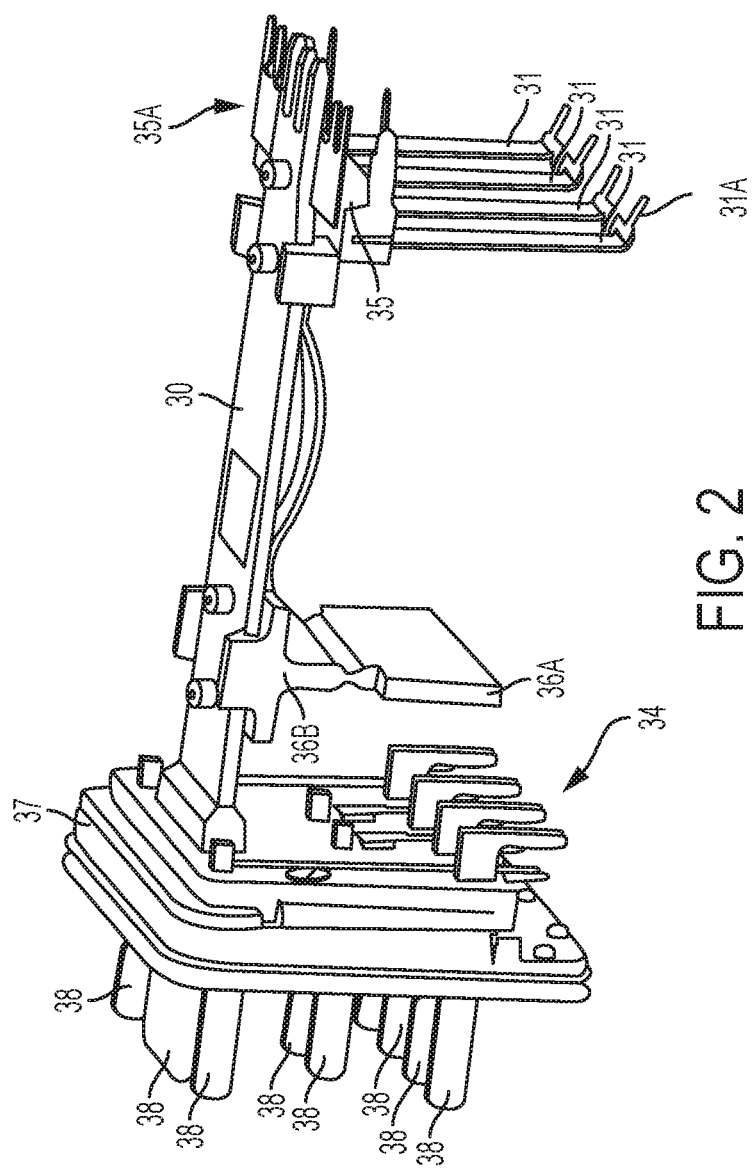
FIG. 2 is a perspective view of the thermal breakers and plastic thermal fuse holder as mounted at a terminal in accordance with the present invention.

As shown in FIGS. 1-5, the thermal—breaker element for a glow plug control thermal fuse (for fuse function in the example for four glow plugs) of the present invention includes four (single ended) thermal breakers 31 (but could have any number of breakers or springs). The thermal breakers are made out of elastic metal pieces or spring elements, which are biased towards an initial state or orientation (such as the generally straight configuration as shown in FIGS. 1 and 2). The thermal breakers are overmolded by a fixation structure 35 and a removable spacer structure 36 (which comprises removable part 36A and a portion 36B that is the part of the removable spacer structure that remains when the removable part 36A is removed) is also molded as part of the fixation structure in the same molding step. The molded piece or structure or preform is attached to or mounted on a terminal or connector piece having an elongated element or node bar 30, which lead to the base body 37. The nodes 38 on the base body 37 are the plug interfaces to the vehicle junction box (or fuse box). The node bar 30 comprises a flexible element to which the spacer structure 36 attaches at a distance spaced from where the fixation structure 35 attaches (as shown in FIG. 2).

Figure 3:
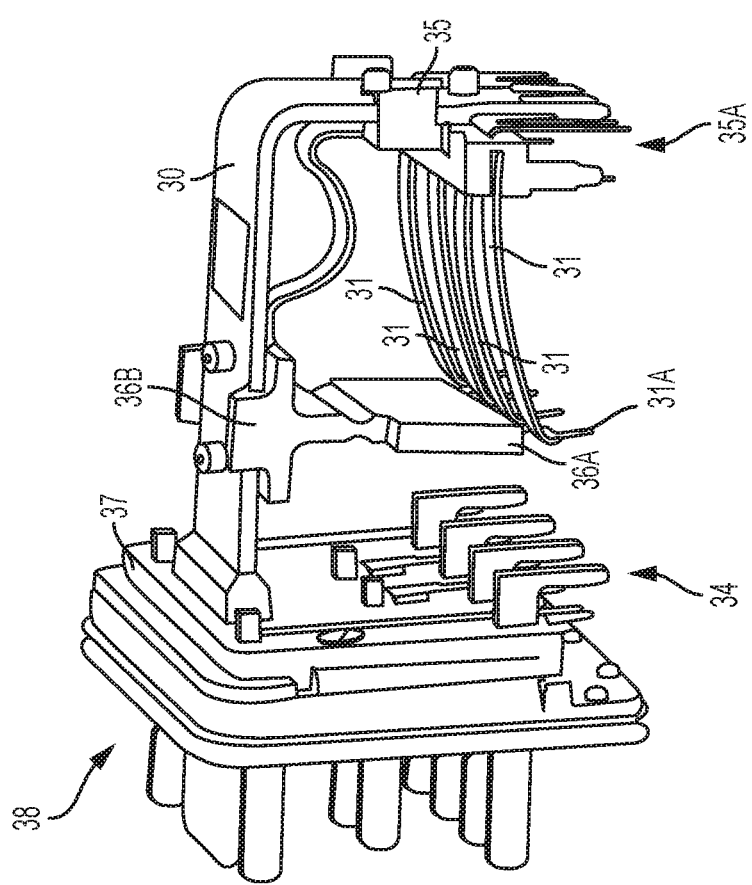
FIG. 3 is a perspective view of the terminal of FIG. 2, shown in its bent orientation to move the thermal springs into contact with a removable portion of the thermal fuse holder and thus tensioned or biased or urged into contact with a circuit board in accordance with the present invention.
Figure 4:
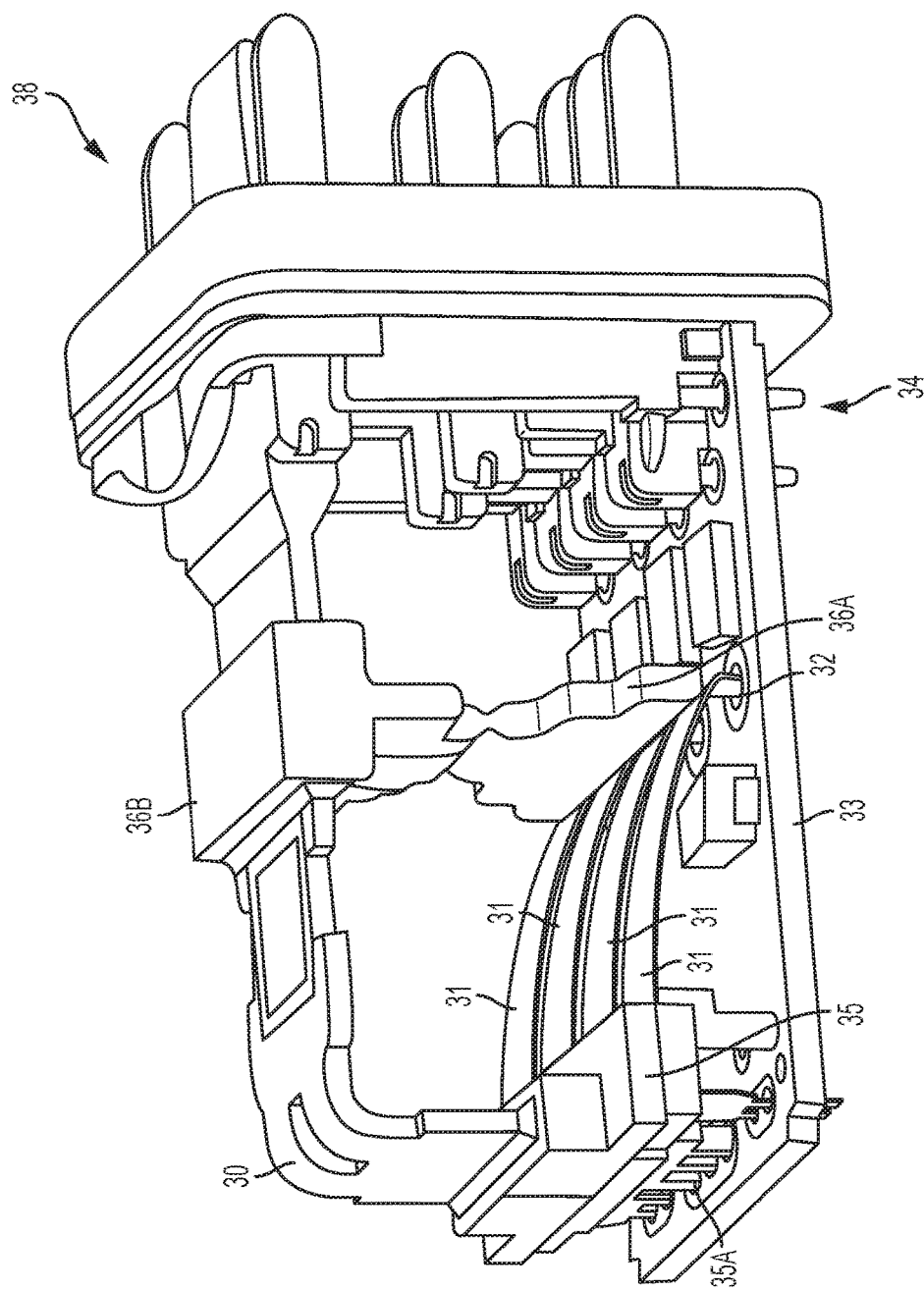
FIG. 4 is a perspective view of the terminal of FIG. 3, as assembled on a glow plug controller's PCB, before removing the removable portion of the thermal fuse holder, with the plug interface visible on the right.

In the assembly process, the node bar 30 is bent (in this example by 90 degrees), which moves the ends of the breaker elements 31 into contact with the spacer structure 36A and biased towards the spacer structure such that tension is applied to the thermal breakers, such as shown in FIG. 3 (showing the breaker elements 31 flexing due to contact with the spacer structure 36A). The whole structure (with the node bar in its bent state or orientation) is soldered onto a PCB 33, with the terminals 34 of the base body 37 received at or electrically connected with circuitry at respective locations or holes at the PCB 33, and with the terminals 35A of the fixation structure 35 received at or electrically connected with circuitry at respective locations or holes at the PCB 33, and with the terminals 31A of the thermal breakers 31 electrically connected with circuitry at locations 32 of the PCB 33, such as shown in FIG. 4. As can be seen with reference to FIGS. 4 and 5, the PCB 33 has electrically conductive traces that electrically connect the locations where the terminals 34 are disposed and the locations where the terminals of the thermal breakers 31 are disposed. Thus, when the thermal breakers are electrically connected at locations 32, electrical connection is made between the terminals 34 of the base body and the terminals 35A of the fixation structure 35 via the thermal breakers 31.

Figure 5:
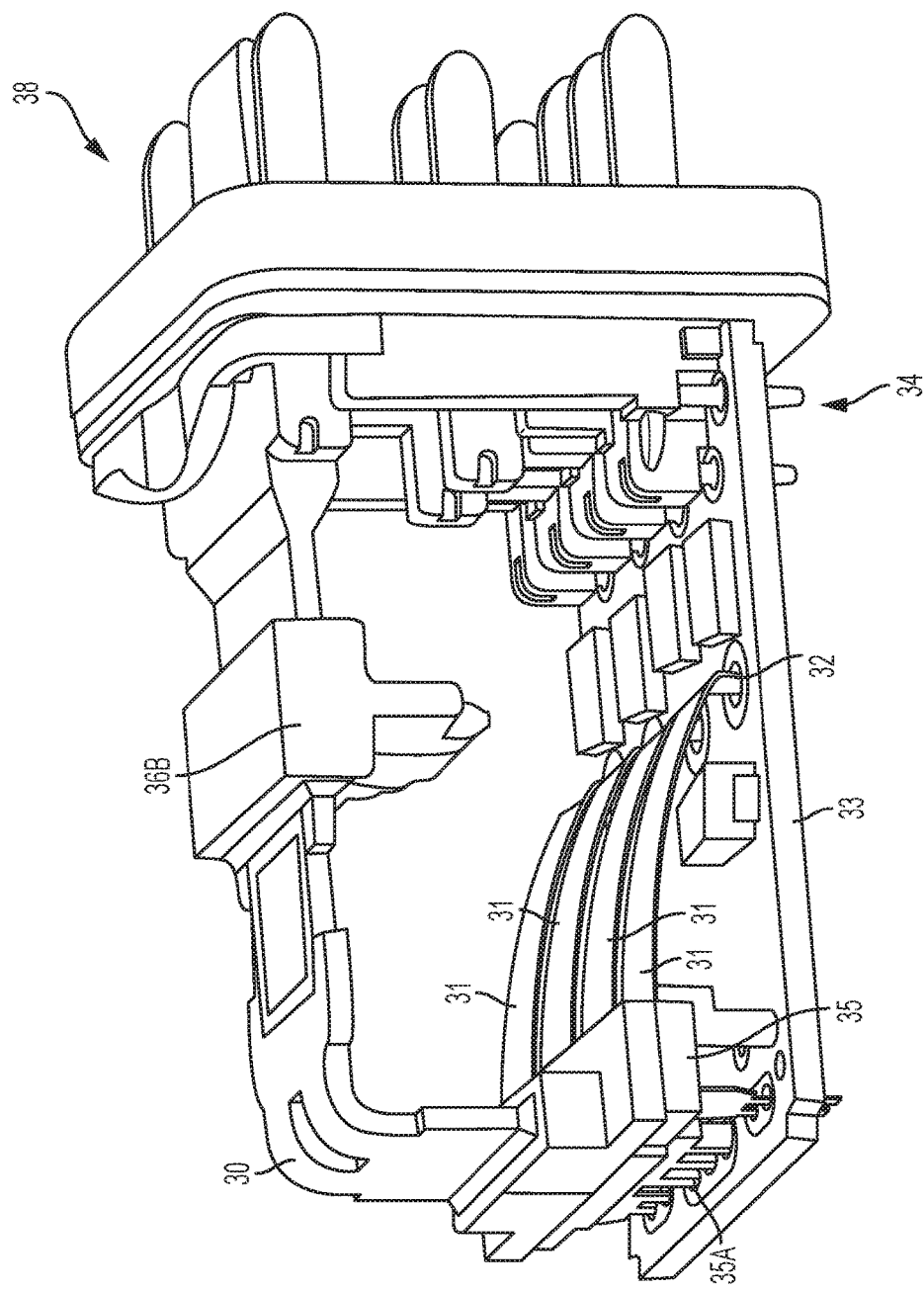
FIG. 5 is a perspective view of the terminal of FIG. 3, as assembled on a glow plug controller's PCB, with the removable portion of the thermal fuse holder removed.

After soldering of the thermal breakers at the PCB, the spacer element 36A is removed (such as by breaking along the narrowed portion or neck of the spacer), such as shown in FIG. 5, whereby the breaker elements are biased away from the PCB (due to their bias toward their initial unbent or unflexed state). By removing the spacer element 36A, the breaker elements have the clearance for lifting from the PCB when triggered or released from the PCB due to high current melting the respective solder point at the PCB through hole 32. Optionally, the spacer element may be broken or torn off or may include a perforation for easing the tearing off. Optionally, the spacer element 36A and part 36B are molded as unitary molded plastic element with a narrowed neck region to ease breaking of spacer element 36A from part 36B.

When the terminals are soldered at the PCB and the spacer element is removed for giving clearance to the breaker elements when in use, the breaker elements are bent or curved (see FIG. 3) and are biased towards their initial state and are thus biased to move away from the PCB. Thus, if the circuit heats to a temperature sufficient to melt the solder that holds the terminals of the breaker elements 31 at the PCB 33, the breaker elements 31 will move away from the PCB 33 to their initial state (shown in FIGS. 1 and 2). When one or more of the breaker elements 31 is disconnected from the respective terminal location(s) 32 of the PCB, electrical connection is broken between the respective terminal(s) 34 and terminal(s) 35A.

Thus, the thermal fuse of the present invention provides a safety function against high power dissipation losses in glow plug control devices (and optionally other control devices), and is capable to be used in various housing types, such as with horizontal PCBs or the like. The removable spacer element or structure eases assembly of the control device by temporarily holding the terminals of the breaker elements in place at the PCB so that the terminals can be soldered at the PCB. After the soldering is complete, the spacer element can be removed, whereby the terminals of the breaker elements are held at the PCB by the solder but are biased away from the PCB, such that when the circuit heats to sufficiently melt the solder joint or joints at the terminals of the breaker elements, the breaker element or elements move towards their initial state and move the terminals away from the PCB to break the electrical connection of the breaker elements with circuitry at the PCB.

Changes and modifications to the specifically described embodiments may be carried out without departing from the principles of the present invention, which is intended to be limited only by the scope of the appended claims as interpreted according to the principles of patent law.

The invention claimed is:

1. A control device suitable for use in a vehicle, said control device comprising:

a circuit board having circuitry disposed thereat;

a thermal fuse holder comprising a removable spacer element;

wherein said thermal fuse holder is attached at a fixation structure and wherein a plurality of breaker elements extend from said fixation structure, and wherein, when said fixation structure is mounted to said circuit board, said breaker elements engage said removable spacer element to hold a plurality of terminals of said breaker elements at said circuit board;

wherein, after a plurality of terminals of said fixation structure and said terminals of said breaker elements are soldered at said circuit board, said removable spacer element is removed from said thermal fuse holder, whereby said terminals of said breaker elements are held in contact with said circuit board via respective solder joints and are biased away from said circuit board; and wherein, when a temperature at one of the solder joints exceeds a threshold temperature and when the solder joint sufficiently melts, a respective one of said terminals of said breaker elements at that solder joint moves away from said circuit board to break the electrical connection at that solder joint.

2. The control device of claim 1, wherein said fixation structure is attached at an elongated element of said thermal fuse holder and wherein said elongated element is bent when said terminals of said fixation structure and said terminals of said breaker elements are soldered at said circuit board to bring said breaker elements into contact with said removable spacer element.

3. The control device of claim 2, wherein said elongated element is bent about 90 degrees when said terminals of said fixation structure and said terminals of said breaker elements are soldered at said circuit board to bring said breaker elements into contact with said removable spacer element.

4. The control device of claim 1, wherein said removable spacer element is removed via one of (i) breaking said removable spacer element from said thermal fuse holder, (ii) tearing said removable spacer element from said thermal fuse holder and (iii) breaking or tearing along a perforated portion of said thermal fuse holder.

5. The control device of claim 1, wherein said removable spacer element functions to flex said breaker elements to urge said terminals of said breaker elements into engagement with said circuit board when said fixation structure is mounted to said circuit board.

6. The control device of claim 1, wherein said thermal fuse holder comprises a plastic or polymeric material.

7. The control device of claim 6, wherein said breaker elements comprise metallic elements.

8. The control device of claim 1, wherein said control device comprises a glow plug control device for controlling at least one glow plug of a diesel engine of a vehicle.

9. A method of providing a thermal fuse at a control device suitable for use in a vehicle, said method comprising:
providing a circuit board having circuitry disposed thereat;
providing a thermal fuse holder comprising a removable spacer element;
attaching said thermal fuse holder at a fixation structure, wherein a plurality of breaker elements extend from said fixation structure;
mounting said fixation structure to said circuit board, wherein mounting said fixation structure comprises engaging said terminals of said breaker elements with said circuit board and engaging said breaker elements with said removable spacer element to hold said terminals of said breaker elements at said circuit board;
soldering said terminals of said breaker elements at said circuit board;
after said terminals of said breaker elements are soldered at said circuit board, removing said removable spacer element from said thermal fuse holder, whereby said terminals of said breaker elements are held in contact with said circuit board via the solder and are biased away from said circuit board; and
wherein, after said removable spacer element is removed, each of said terminals of said breaker elements is movable away from said circuit board to break the electrical connection at a solder joint at a respective terminal of said terminals of said breaker elements when a temperature at that solder joint exceeds a threshold temperature and when that solder joint sufficiently melts.

10. The method of claim 9, comprising bending an elongated element of said thermal fuse holder when mounting said fixation structure to said circuit board to bring said breaker elements into contact with said removable spacer element.

11. The method of claim 10, wherein said elongated element is bent about 90 degrees when mounting said fixation structure to said circuit board to bring said breaker elements into contact with said removable spacer element.

12. The method of claim 9, wherein removing said removable spacer element comprises one of (i) breaking said removable spacer element from said thermal fuse holder, (ii) tearing said removable spacer element from said thermal fuse holder and (iii) breaking or tearing along a perforated portion of said thermal fuse holder.

13. The method of claim 9, wherein said removable spacer element functions to bend said breaker elements to urge said terminals of said breaker elements into engagement with said circuit board when mounting said fixation structure to said circuit board.

14. The method of claim 9, wherein said removable spacer element comprises a polymeric material.

15. The method of claim 14, wherein said breaker elements comprise metallic elements.

16. The method of claim 9, wherein said control device comprises a glow plug control device for controlling at least one glow plug of a diesel engine of a vehicle.

17. A control device suitable for use in a vehicle, said control device comprising:
a circuit board having circuitry disposed thereat;
a base body comprising a plurality of terminals;
a fixation structure comprising a plurality of breaker elements extending from a plurality of terminals of said fixation structure;
wherein said base body and said fixation structure are mechanically joined via an elongated element;
a removable spacer element disposed at said elongated element;
wherein said base body and said fixation structure are mounted to said circuit board to electrically connect said terminals of said base body and said terminals of said fixation structure at respective circuitry of said circuit board;
wherein, when said base body and said fixation structure are mounted to said circuit board, said breaker elements engage said removable spacer element to hold terminals of said breaker elements at said circuit board;
wherein, after said terminals of said breaker elements are soldered at said circuit board, said removable spacer element is removed from said elongated element, whereby said terminals of said breaker elements are held in contact with said circuit board via respective solder joints and are biased away from said circuit board; and
wherein, after said removable spacer element is removed from said elongated element, respective ones of said breaker elements are movable away from said circuit board to break the electrical connection at respective solder joints when a temperature at a respective solder joint exceeds a threshold temperature and when the respective solder joint sufficiently melts.

18. The control device of claim 17, wherein said elongated element is bent when said base body and said fixation structure are mounted to said circuit board to bring said breaker elements into contact with said removable spacer element, and wherein said removable spacer element functions to flex said breaker elements to urge said terminals of said breaker elements into engagement with said circuit board when said base body and said fixation structure are mounted to said circuit board.

19. The control device of claim 17, wherein said removable spacer element is removed from said elongated element via one of (i) breaking said removable spacer element from said elongated element and (ii) tearing said removable spacer element from said elongated element.

20. The control device of claim 17, wherein said control device comprises a glow plug control device for controlling at least one glow plug of a diesel engine of a vehicle.

* * * * *